United States Patent [19]
Tanaka

[11] Patent Number: 5,610,419
[45] Date of Patent: Mar. 11, 1997

[54] SEMICONDUCTOR INTEGRATED CIRCUIT DEVICE WITH ELEMENTS ISOLATED BY TRENCHES

[75] Inventor: Shinichi Tanaka, Tokyo, Japan

[73] Assignee: Kabushiki Kaisha Toshiba, Kawasaki, Japan

[21] Appl. No.: 404,605

[22] Filed: Mar. 15, 1995

[30] Foreign Application Priority Data

Mar. 16, 1994 [JP] Japan .................................. 6-046115

[51] Int. Cl.⁶ ..................... H01L 27/108; H01L 29/76; H01L 29/788
[52] U.S. Cl. ..................... 257/315; 257/301; 257/304; 257/314; 257/316
[58] Field of Search .................................. 257/301, 314, 257/315, 316, 304

[56] References Cited

U.S. PATENT DOCUMENTS

| | | |
|---|---|---|
| 4,959,812 | 9/1990 | Momodomi et al. . |
| 4,996,669 | 2/1991 | Endoh et al. . |
| 5,050,125 | 9/1991 | Momodomi et al. . |
| 5,088,060 | 2/1992 | Endoh et al. . |
| 5,386,132 | 1/1995 | Wong ..................... 257/320 |
| 5,488,244 | 1/1996 | Quek et al. ............. 257/315 |

FOREIGN PATENT DOCUMENTS

6163925  6/1994  Japan ..................... 257/315

*Primary Examiner*—Mahshid D. Saadat
*Assistant Examiner*—Valencia Martin Wallace
*Attorney, Agent, or Firm*—Finnegan, Henderson, Farabow, Garrett & Dunner, L.L.P.

[57] ABSTRACT

A plurality of trenches are formed in parallel at the main surface of a semiconductor substrate. Memory cells of a NAND type $E^2$ PROM are formed in the semiconductor substrate at the bottoms of the trenches. Memory cells of the NAND type $E^2$ PROM are also formed in the semiconductor substrate of each projecting portion between the trenches. The memory cells of the NAND type $E^2$ PROM formed in the semiconductor substrate at the bottoms of the trenches are isolated from the memory cells of the NAND type $E^2$ PROM formed in the semiconductor substrate of each projecting portion between the trenches by separating the former from the latter in the direction of depth of the trenches.

21 Claims, 10 Drawing Sheets

SEMICONDUCTOR INTEGRATED CIRCUIT DEVICE WITH ELEMENTS ISOLATED BY TRENCHES

BACKGROUND OF THE INVENTION

1. Field of the Invention

This invention relates to a semiconductor integrated circuit device with elements isolated by trenches, and more particularly to a semiconductor integrated circuit device most suitable for semiconductor memory devices, such as NAND type $E^2$ PROMs or NOR type $E^2$ PROMs.

2. Description of the Related Art

Figure 1:
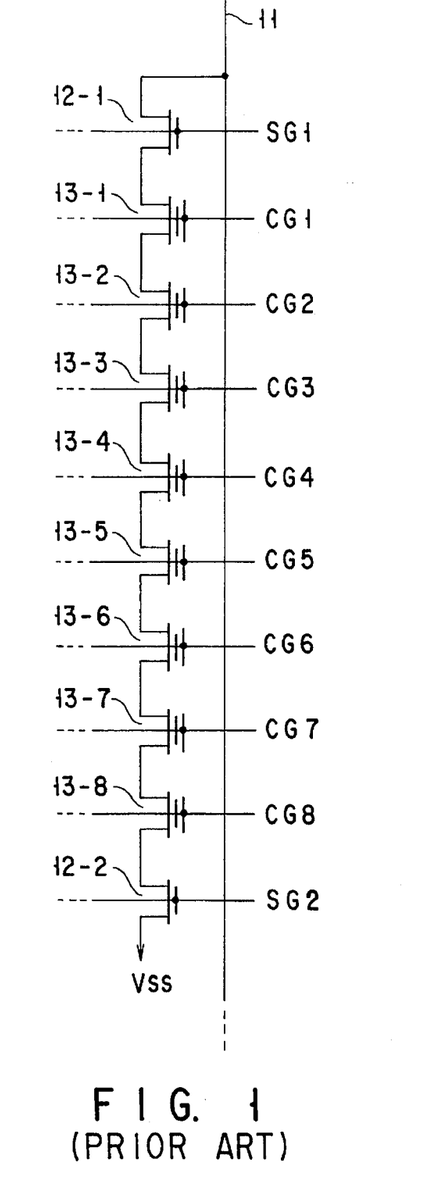
FIG. 1 is intended for explanation of a conventional semiconductor integrated circuit device, and is a circuit diagram of a memory cell section in a NAND type $E^2$ PROM.
Figure 2:
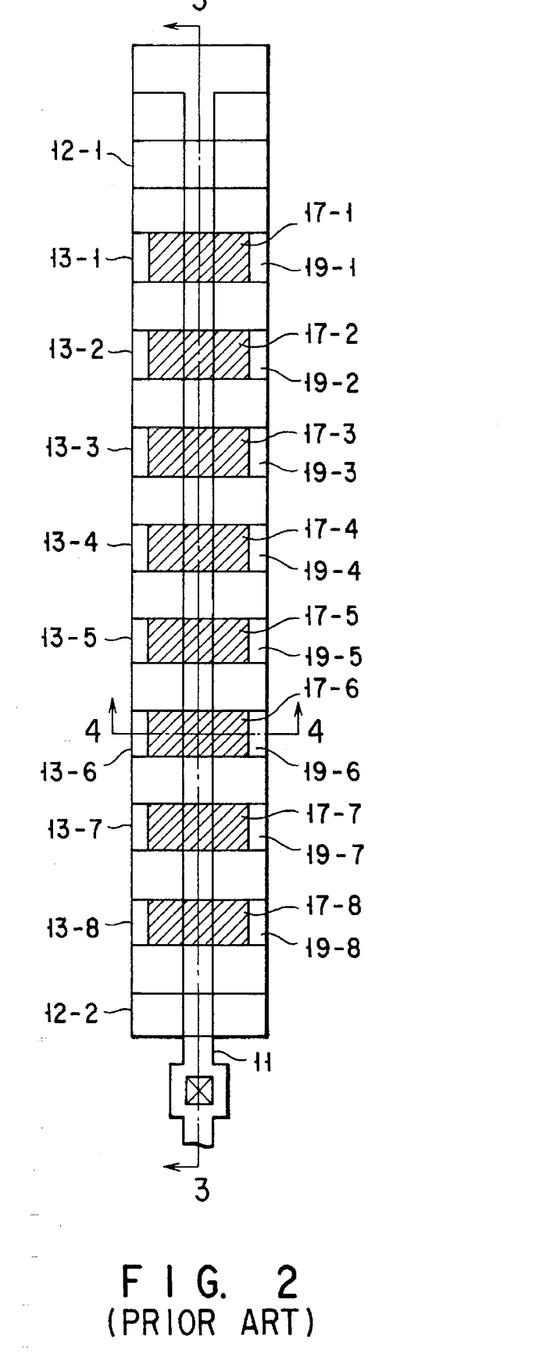
FIG. 2 is a pattern plan view of the circuit shown in FIG. 1.
Figures 3, 4:
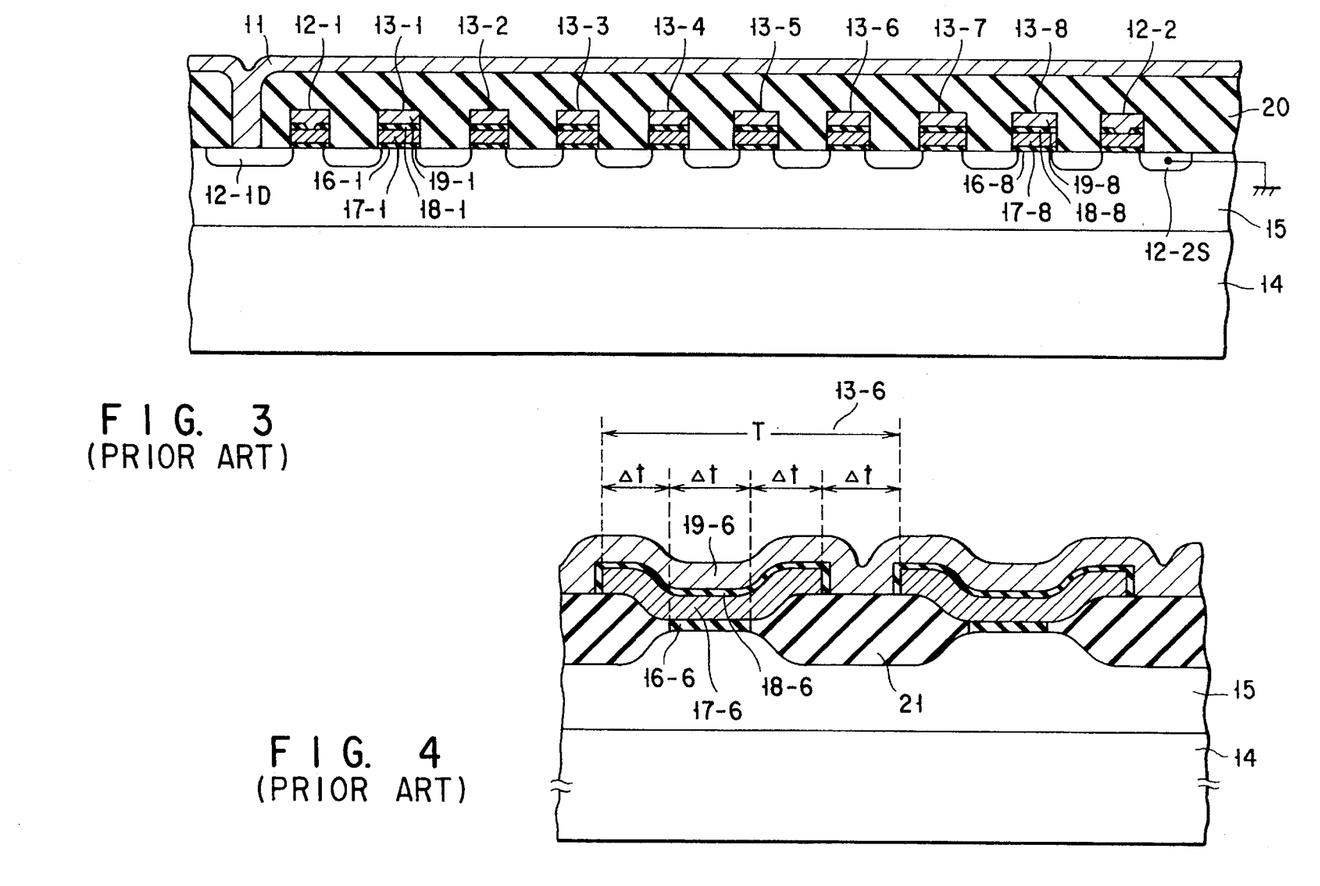
FIG. 3 is a sectional view taken along line 3—3 in the pattern of FIG. 2.
FIG. 4 is a sectional view taken along line 4—4 in the pattern of FIG. 2 together with a cross section of adjoining memory cell portions.

NAND type $E^2$ PROMs have been constructed as shown in FIGS. 1 to 4, for example. FIG. 1 is a circuit diagram of a memory cell section in a NAND type $E^2$ PROM. FIG. 2 is a pattern plan view of the circuit shown in FIG. 1. FIG. 3 is a sectional view taken along line 3—3 in the pattern of FIG. 2. FIG. 4 is a sectional view taken along line 4—4 in the pattern of FIG. 2 together with a cross section of adjoining memory cell portions. This type of NAND $E^2$ PROM has been disclosed in, for example, U.S. Pat. No. 4,996,669, U.S. Pat. No. 5,088,060, U.S. Pat. No. 4,959,812, and U.S. Pat. No. 5,050,125.

As shown in FIG. 1, with the memory cells in the NAND type $E^2$ PROM, the respective current paths of a cell select MOS transistor 12-1, cell transistors 13-1 to 13-8, and a cell select MOS transistor 12-2 are connected in series between a bit line 11 and a power supply Vss (a grounding point or a reference potential supply). The gates of the MOS transistors 12-1, 12-2 are supplied with select signals SG1, SG2, respectively. When these MOS transistors 12-1, 12-2 are turned on, the memory cell section is selected. The control gates of the individual cell transistors 13-1 to 13-8 are connected to word lines. By the row select signals CG1 to CG8 outputted from a row decoder, any one of the cell transistors is selected and then the data is programmed or read out.

As shown in FIGS. 2 to 4, the memory cell section is formed in a p-well region 15 formed in the surface region of an n-type semiconductor substrate 14. The MOS transistor 12-1, the individual cell transistors 13-1 to 13-8, and the MOS transistor 12-2 each share drain regions and source regions with the adjoining transistors. On the substrate 14 between the drain and source regions of the individual cell transistors 13-1 to 13-8, first gate insulating films 16-1 to 16-8 through which tunnel current flows, floating gates 17-1 to 17-8, second insulating films 18-1 to 18-8, and control gates 19-1 to 19-8 are stacked one on top of another in that order. The MOS transistors 12-1, 12-2 are formed in the same process as the cell transistors 13-1 to 13-8. Although they have floating gates and control gates, short-circuiting these gates enables them to function as cell select MOS transistors. On the individual transistors 12-1, 13-1 to 13-8, 12-2, an interlayer insulating film 20 is formed. On the interlayer insulating film 20, the bit line 11 is placed. The bit line 11 is formed in the direction in which the current paths of the cell transistors 13-1 to 13-8 are connected in series, and is connected to the drain region 12-1D of the MOS transistor 12-1. On the other hand, the grounding point Vss is connected to the source region 12-2S of the MOS transistor 12-2.

With the NAND type $E^2$ PROM thus constructed, a state where the threshold voltage (Vth) of the transistor is in the range from 0 V to 5 V as a result of injecting electrons into the floating gate, is defined as data "0", and a state where the threshold voltage is below 0 V is defined as data "1". At the time of programming, a high voltage of about 20 V is applied to the word line connected to the control gate of the selected cell transistor and 0 V is applied to the bit line. As a result of this, by an electric field (about 13 MVcm$^{-1}$) with respect to the substrate caused by the potential (about 13 V) of the floating gate risen according to the coupling ratio of capacitance C1 between the control gate and the floating gate to capacitance C2 between the floating gate and the channel region, tunnel current is generated, thereby injecting electrons into the floating gate. At this time, an intermediate potential of about 12 V is applied to the unselected bit lines to prevent erroneous writing, thereby reducing the voltage difference between the floating gate and the substrate. Erasing is effected by applying a voltage of about 20 V to the substrate (normally, the p-type well region), thereby applying a high electric field to extract electrons from the floating gate. Since the NAND type $E^2$ PROM is what is called a flash memory, all of the bits are erased at the same time or bits are erased in blocks. At this time, the floating gate is overerased and thereby charged positively, placing the cell transistor in the depletion mode. Reading to judge whether the stored data item is "1" or "0" is effected by setting the word line of the selected cell at 0 V and the bit line at 5 V, and the word lines of the unselected word lines at 5 V.

What has been explained above is about the basic principle of the NAND type $E^2$ PROM. Because in the NAND type $E^2$ PROM, the bit lines need not be brought into contact with the cell transistors on a one-to-one basis as shown in FIGS. 2 and 3, the number of contacts can be decreased as compared with the NOR type, leading to a smaller cell size.

NAND type $E^2$ PROMs have lately attracted attention as devices that would replace HDDs (hard disk drives) in the future and therefore they have been requested to have a much larger capacity, be lower in cost, and be reduced further in cell size. In the present cell arrangement, however, as shown in the sectional view across the channel width in FIG. 4, the area of the element isolation region 21 (a field oxide film formed by LOCOS techniques) is larger than that of the cell transistor, and the area necessary for element isolation occupies three times as large as the area used for a tunneling phenomenon. Specifically, if the minimum design rule is $\Delta t$, the width of a first gate insulating film 16-6 through which tunnel current flows is $\Delta t$, whereas a width of $\Delta t$ is required on both sides of the insulating film 16-6 when element isolating regions 21 are formed on both sides of the insulating film 16-6. Consequently, the width of the floating gate 17-6 is the value obtained by adding $2\Delta t$ to the width of the insulating film 16-6, that is, $3\Delta t$. Since a space of $\Delta t$ is needed between adjoining floating gates, $4\Delta t$ is required for the width T of a single cell transistor.

As noted above, with the conventional NAND type $E^2$PROM, the existence of element isolation regions forces the principle of "the minimum design rule×4" to be always followed in determining the cell size. To reduce the cell size remarkably in the future, the element isolation regions must be reduced considerably.

Other semiconductor storage devices and semiconductor integrated circuit devices, such as NOR type $E^2$ PROMs have a similar problem as the aforementioned NAND type $E^2$ PROM has, wherein the existence of element isolation regions prevents the reduction of chip size and high integration significantly.

SUMMARY OF THE INVENTION

Accordingly, a first object of the present invention is to provide a semiconductor integrated circuit device which enables chip-size reduction and higher integration by reducing the element isolation regions.

A second object of the present invention is to provide a NAND type $E^2$ PROM which enables chip-size reduction and higher integration by reducing the element isolation regions.

A third object of the present invention is to provide NOR type $E^2$ PROM which enables chip-size reduction and higher integration by reducing the element isolation regions.

The first object is accomplished by providing a semiconductor integrated circuit device comprising: a semiconductor substrate; a plurality of trenches formed in parallel at the main surface of the semiconductor substrate; semiconductor elements formed at the bottoms of the trenches and at the projecting portions between the trenches, wherein the semiconductor elements formed at the bottoms of the trenches are isolated from the semiconductor elements formed at the projecting portions between the trenches by separating the former from the latter in the direction of depth of the trenches.

With such a structure, the semiconductor elements formed at the bottom of each trench are isolated from those formed on each projecting portion between trenches by separating the former from the latter in the direction of depth of the trenches, or in other words, in the direction perpendicular to the main surface of the semiconductor substrate. Therefore, it is possible to reduce the width of the element isolation region on the pattern plane, and thereby achieve the reduction of the chip size and higher integration.

The second and third objects of the invention are accomplished by providing a semiconductor integrated circuit device comprising: a semiconductor substrate; a plurality of trenches formed in parallel at the surface of the semiconductor substrate; active regions formed separately from each other at the bottom of each of the trenches and in the semiconductor substrate of each projecting portion between the trenches; a plurality of floating gates each provided above and between the active regions at the bottom of each of the trenches and above and between the active regions formed on each projecting portion between the trenches; and a control gate extended over the plurality of floating gates in the direction that crosses the trenches, wherein the cell transistors formed at the bottom of each of the trenches are electrically isolated from the cell transistors formed on each projecting portion between the trenches by separating the former from the latter in the direction of depth of the trenches.

With such a structure, the cell transistors formed at the bottom of each trench are electrically isolated from those formed on each projecting portion between trenches by separating the former from the latter in the direction of depth of the trenches. Therefore, it is possible to reduce the width of the element isolation region on the pattern plane and thereby achieve the reduction of the cell size and higher integration. The element isolation regions can be reduced remarkably by forming a plurality of cell transistors sharing the source and drain regions at each trench and on each projecting portion between trenches so that their current paths are connected in series. Therefore, this structure is best suited for NAND type $E^2$ PROMs and NOR type $E^2$ PROMs whose size is urgently desired to be smaller.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF HE PREFERRED EMBODIMENTS

Figure 5:
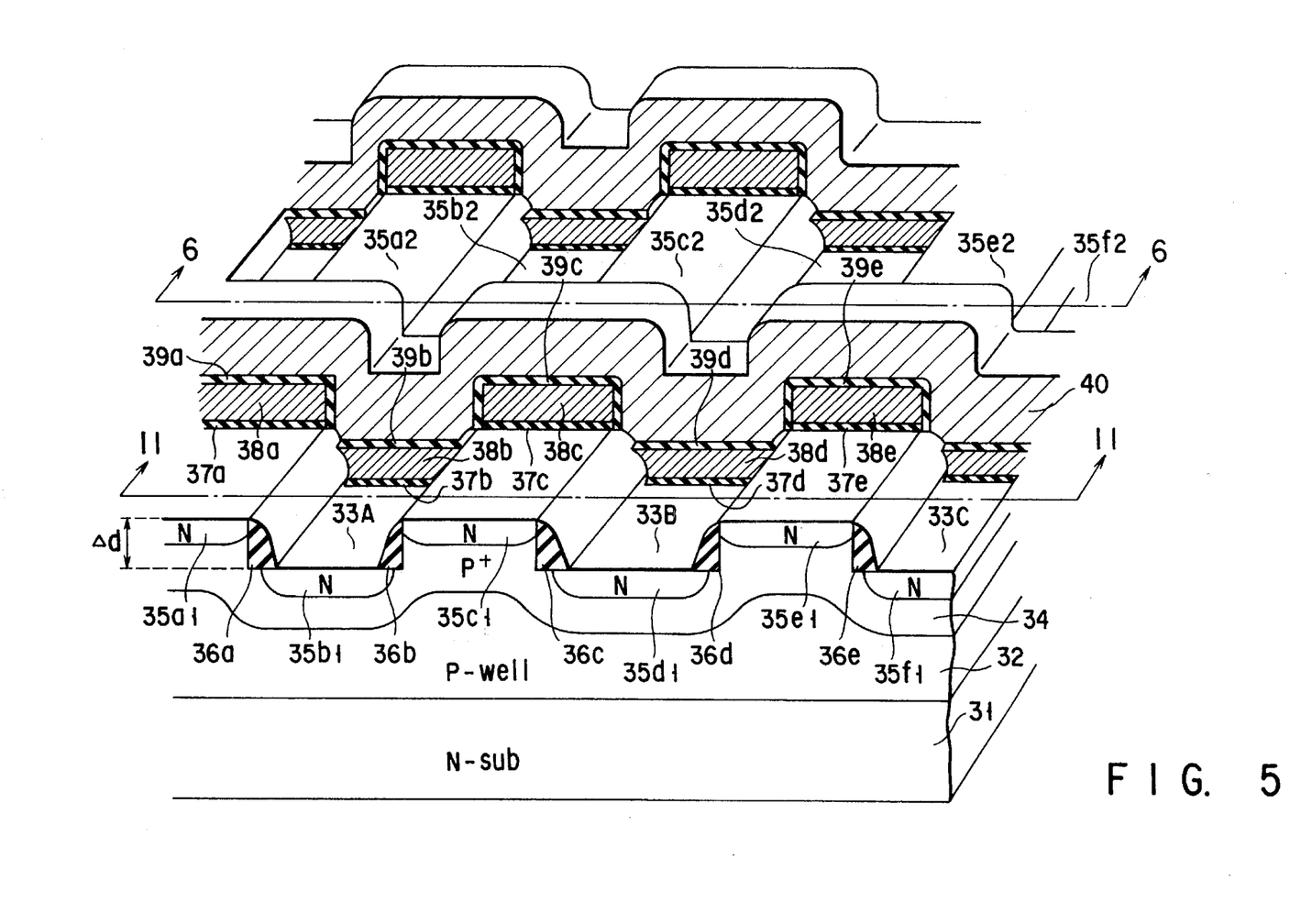
FIG. 5 is intended for explanation of a semiconductor integrated circuit device according to a first embodiment of the present invention, and is a perspective view of the important portion of a NAND type $E^2$PROM.

FIGS. 5 to 18 are intended for explanation of a semiconductor integrated circuit device according to a first embodiment of the present invention: FIG. 5 is a perspective view of the important portion of a NAND type $E^2$ PROM; FIGS. 6 to 18 are sectional views of the manufacturing processes for the $E^2$ PROM shown in FIG. 5, arranged in the order of manufacturing.

As shown in FIG. 5, in the surface region of an n-type semiconductor substrate 31, a p-well region 32 is formed. In the surface region of the substrate 31 (well region 32), a plurality of trenches 33A, 33B, 33C, . . . are formed in parallel in a first direction. The width of and the spacing between these trenches 33 are each basically determined by the minimum design rules, and the depth Δd is about 1.5 μm. Along the projecting and recessed portions caused by the trenches 33 in the substrate 31, a p+-type impurity diffusion layer 34 is formed in the well region 31. In the impurity diffusion layer 34 of each projecting portion between the trenches 33 and in the impurity diffusion layer 34 at the bottom of the individual trenches 33, n-type impurity diffusion layers $35a1, 35a2, \ldots, 35b1, 35b2, \ldots, 35c1, 35c2, \ldots, 35d1, 35d2, \ldots, 35e1, 35e2, \ldots, 35f1, 35f2, \ldots$ which function as the source and drain regions (active regions) of the cell transistors, are formed in the first direction so as to be separated from each other. The diffusion depth of these n-type impurity diffusion layers is about 0.3 µm. On the sidewalls of the trenches 33A, 33B, 33C, . . . are provided with spacers 36a, 36b, 36c, 36d, 36e, . . . formed of insulating layers such as $SiO_2$ films, respectively. The width of these spacers is about 0.1 µm. On the substrate 31 (the impurity diffusion layer 34) between the impurity diffusion layers $35b1, 35b2$ in the trench 33A, a first gate insulating film 37b is formed. On the insulating film 37b, a floating gate 38b is provided. On the diffusion layer 34 between the diffusion layers $35d1, 35d2$ in the trench 33B, a first gate insulating film 37d is formed. On the insulating film 37d, a floating gate 38d is provided. On the diffusion layer 34 between the impurity diffusion layers $35c1, 35c2$ in the projecting portion between the trenches 33A, 33B, a first gate insulating film 37c is formed. On the insulating film 37c, a floating gate 38c is provided. Similarly, in each of the other trenches and in the individual projecting portions between these trenches, the first gate insulating films and floating gates are formed, respectively. The first gate insulating film 37 carries tunnel current and has a thickness ranging from 80 to 100 Å. The floating gate 38 has a thickness of about 1.0 µm, and is composed of a first layer of a phosphorus-doped polysilicon layer.

On the exposed surfaces of the floating gate 38, second gate insulating films 39a, 39b, 39c, 39d, 39e, . . . , are formed. On these insulating films 39, a control gate 40 is extended over the respective floating gates 38a, 38b, 38c, 38d, 39e, . . . in a second direction perpendicular to the first direction. The thickness of the second gate insulating film 39 ranges from 150 to 250 Å, and the control gate 40 has a thickness of about 1.0 µm and is composed of a second layer of a phosphorus-doped polysilicon layer.

The same arrangement is repeated in the first direction. At the bottom of each trench 33 and on each projecting portion between trenches 33, a memory cell section in a NAND type $E^2$ PROM is formed in the first direction where the current paths of the first cell select MOS transistor, cell transistors, and the second cell select MOS transistor are connected in series as shown in FIG. 1.

Although not shown, on the substrate 31 and control gate 40, an interlayer insulating film is formed. On the interlayer insulating film, bit lines made of aluminium or tungsten silicide are formed in the first direction on the bottom of each trench and each projecting portion between trenches. These bit lines are connected to the drain region 12-1D of the first cell select MOS transistor 12-1 for each memory cell section (e.g., in units of 8 cells or 16 cells) as shown FIGS. 1 to 3. On the other hand, the source region 12-2S of the second cell select MOS transistor 12-2 is connected to a power supply Vss (a grounding point or a reference potential supply). The gates of the first and second cell select MOS transistors are supplied with select signals SG1, SG2, the control gate 40 of each cell transistor is connected to a word line, and the row select signals CG1 to CG8 outputted from the row decoder are supplied.

The purpose of providing a spacer 36 on the sidewall of each trench 33 is to prevent a drop in the bit line potential, when the program is running. Specifically, at the time of programming, a high voltage higher than 20 V is applied to the word line for the selected cell and an intermediate potential (about 12 V) is applied to the unselected bit lines to prevent erroneous writing. Because of this, when the potential of the floating gate has risen to a certain potential (about 10 V) as a result of applying a high potential to the word line, this can allow the sidewall portion of the trench next to the floating gate to become reversed, forming a channel. If a channel were formed, this would bring the channel portion (0 V) of the selected cell and the channel portions of the unselected cells into a conducting state, resulting in a drop in the potential of the unselected bit lines. Thus, provision of the inversion prevention spacer 36 prevents such a drawback.

The reason why a p⁻type impurity diffusion region 34 is formed at the surface of the well region 32 is to achieve the same purpose. The region 34 prevents punch-through from occurring at the sidewall portion of the trench 33 when 0 V is applied to the bit line formed on and along the projecting portion between trenches 33 and an intermediate potential is applied to the bit line formed on and along the recessed portion.

With such a structure, the operation principle of the cell is the same as that of a conventional device, and the programming, reading, and erasing of data are effected essentially in the same manner as the conventional device. Use of such a device structure enables the size of each cell transistor to be reduced remarkably. Specifically, the pitch in the direction in which word lines extend (in the second direction) was "the minimum design rule×4" in the conventional device. For example, if the minimum design rule was 0.4 µm, a width of 1.6 µm would be required for a single cell transistor. In contrast, with the structure of the first embodiment, the pitch is "the minimum design rule+ α (the width of spacer)". If the width α of spacer is 0.1 µm, for example, the pitch can be reduced to "0.4 µm+0.1 µm=0.5 µm". As a result, the cell size is 0.5/1.6=0.312 (31.2%), less than ⅓ the cell size of the conventional device. Therefore, it is possible to reduce the chip size remarkably and achieve high integration, thereby lowering costs.

With the above-mentioned structure, a drop in the coupling ratio during programming somewhat degrades the program characteristics. In a conventional structure where elements are isolated using a field insulating film, existence of a fringe of field insulating film assures the coupling ratio of about 3:1. With the structure shown in FIG. 5, however, the coupling ratio is about 1.5:1. This requires application of a voltage higher than 30 V for programming, whereas in the conventional device, a voltage of about 20 V is applied to the control gate. To suppress a rise in the programming voltage, a negative bias of about −10 V has only to be applied to the selected bit line. The erasing and reading operations are the same as with the conventional device.

The drop in the coupling ratio, however, is not always a drawback, but remarkably reduces the possibility that erroneous writing will take place due to a Vcc gate stress of 3 to 5 V in a read operation, thereby improving the reliability. Therefore, taking this into consideration, the aforesaid values may be set to the optimum values. At present, because of erroneous operations, there have been no devices guaranteed to retain data for 10 years reliably. The above-described structure, however, is guaranteed to retain data for 10 years.

Hereinafter, a method of manufacturing the NAND type $E^2$ PROM shown in FIG. 5 will be described with reference to FIGS. 6 to 18. FIGS. 6 to 10 sequentially illustrate a first to fifth manufacturing steps for cross sections taken along line 6—6 and line 11—11 in FIG. 5. FIGS. 11, 13, 14, and 17 sequentially illustrate a sixth to ninth steps for a cross section taken along line 6—6 in the FIG. 5. FIGS. 12, 14, 16, and 18 sequentially illustrate a sixth to ninth steps for a cross section taken along line 11—11 in the FIG. 5.

Figure 6:
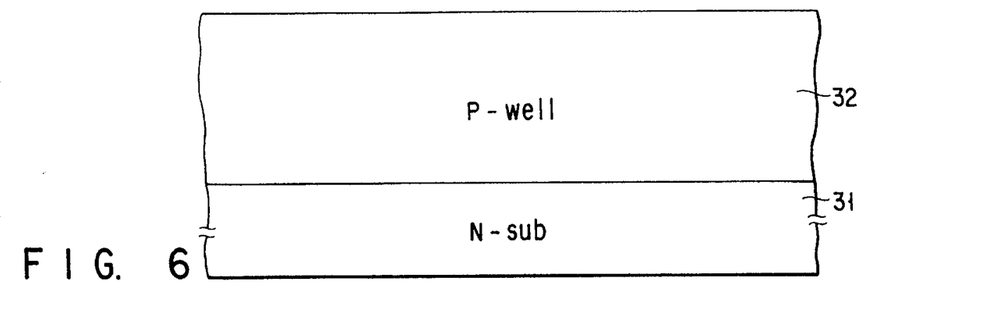
FIGS. 6 to 10 are intended for explanation of a manufacturing method for the NAND type $E^2$ PROM shown in FIG. 5, and are sectional views of manufacturing processes of the cross sections taken along line 6—6 and line 11—11 in FIG. 5.
Figure 7:
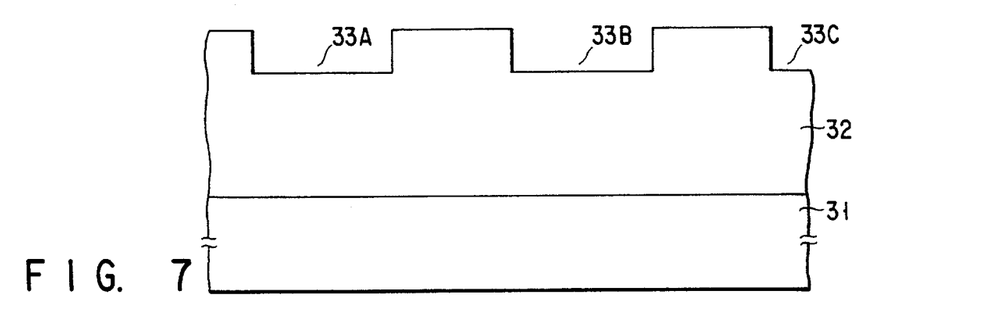
Figure 8:
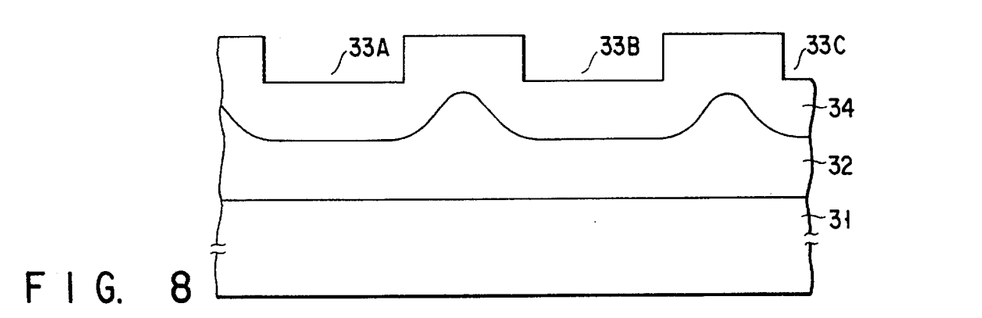
Figure 9:
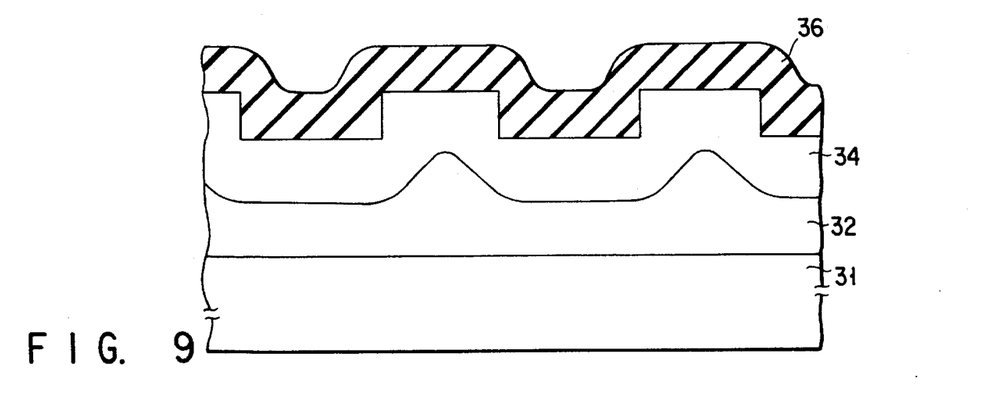
Figure 10:
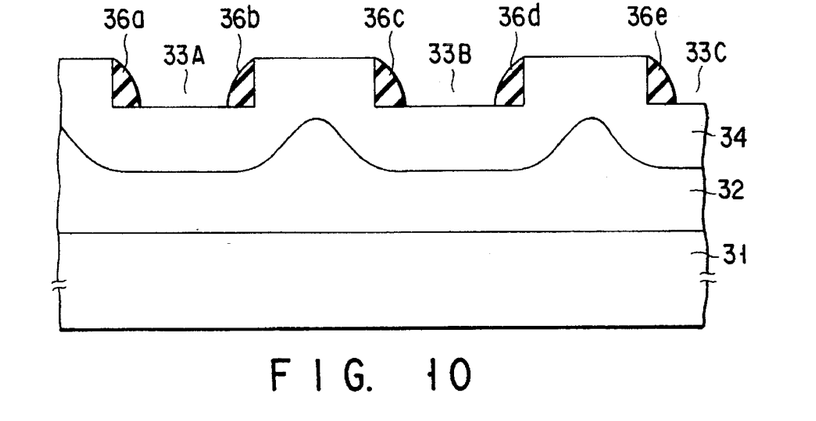
Figure 11:
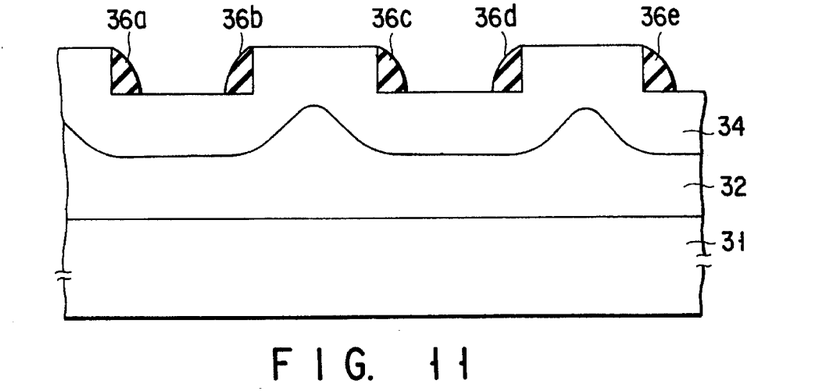
FIGS. 11, 13, 15, and 17 are intended for explanation of a manufacturing method for the NAND type $E^2$ PROM shown in FIG. 5, and are sectional views of manufacturing processes of the cross sections taken along line 6—6 of FIG. 5, following the manufacturing processes shown in FIG. 10.
Figure 12:
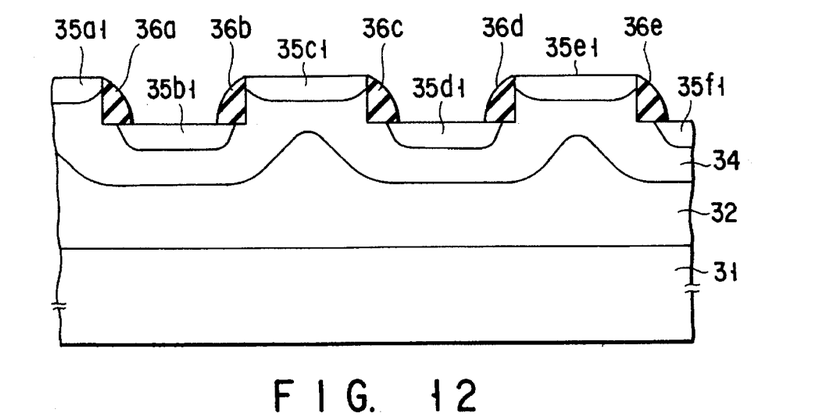
FIGS. 12, 14, 16, and 18 are intended for explanation of a manufacturing method for the NAND type $E^2$ PROM shown in FIG. 5, and are sectional views of manufacturing processes of the cross sections taken along line 11—11 of FIG. 5, following the manufacturing processes shown in FIG. 10.

As shown in FIG. 6, p-type impurities are introduced into the surface region of an n-type semiconductor substrate 31 to form a p-well region 32. Next, a mask is formed on the surface of the semiconductor substrate 31, and then, anistropic etching, such as RIE, is effected to form a plurality of trenches 33A, 33B, 33C, in parallel as shown in FIG. 7. Thereafter, as shown in FIG. 8, p-type impurities, such as boron, are introduced into the surface of the semiconductor substrate 31 to form a $p^+$-type impurity diffusion layer 34 in the surface region of the well region 32. Then, by CVD techniques, a $SiO_2$ film 36 is formed on the substrate 31 (see FIG. 9), and the $SiO_2$ film 36 is removed by effecting anistropic etching, such as RIE, thereby forming spacers 36a, 36b, 36c, 36d, 36e, . . . on the sidewall portions of trenches 33A, 33B, 33C, . . . (see FIG. 10).

Figure 13:
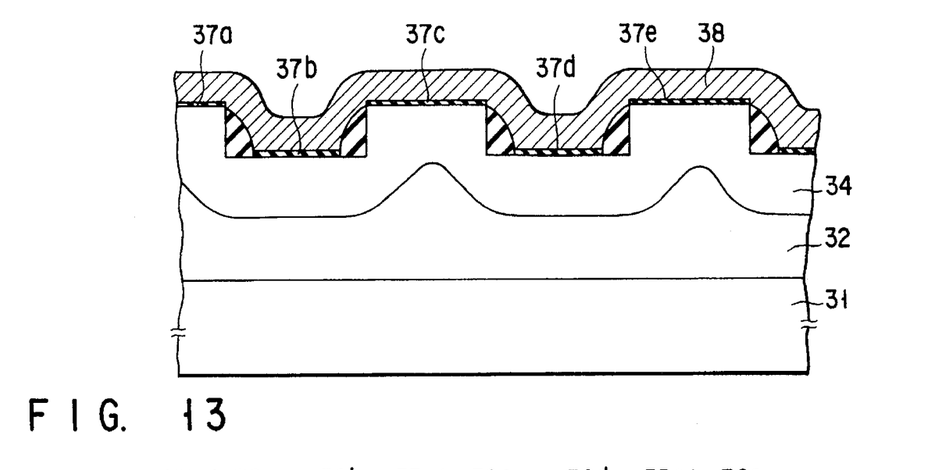
Figure 14:
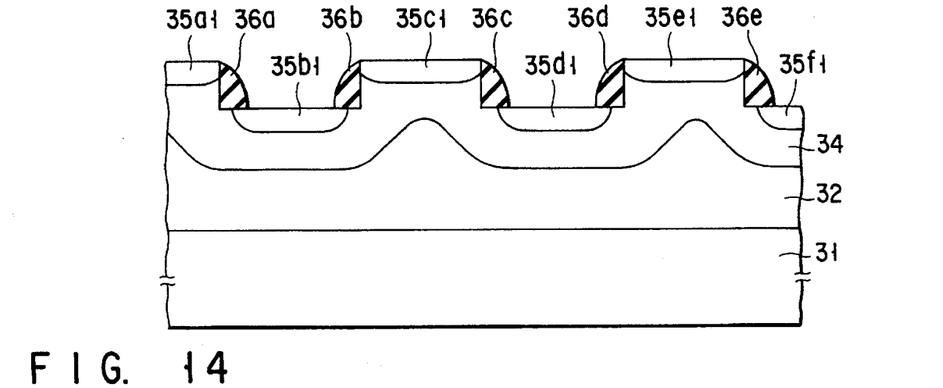
Figure 15:
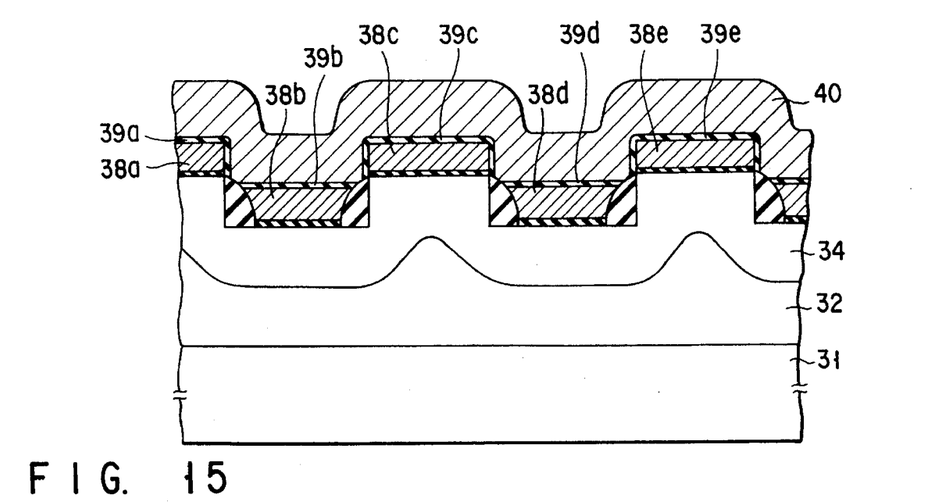
Figure 16:
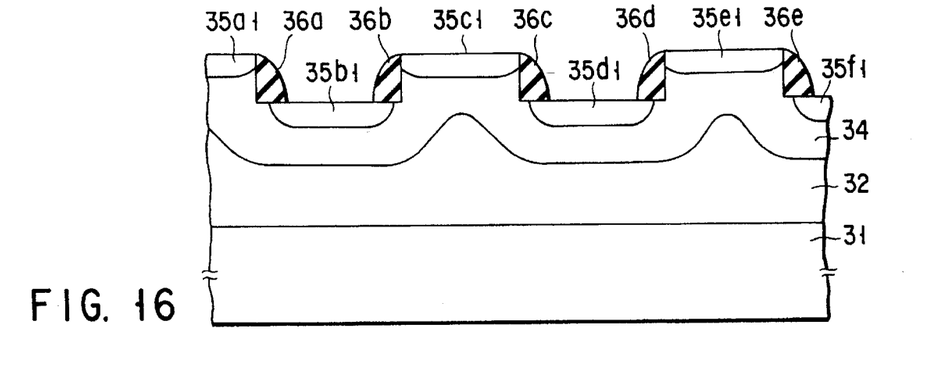

Next, after a mask with a plurality of parallel patterns in the direction perpendicular to the trenches have been formed, n-type impurity ions, such as arsenic, are implanted into the bottoms of the exposed trenches 33 and into the substrate 31 of each projecting portion between trenches 33 to form source and drain regions 35a1, 35b1, 35c1, 35d1, 35e1, 35f1, . . . . Thereafter, as shown in FIGS. 13 and 14, the exposed surfaces of the masked substrate 31 are thermally oxidized to form first gate oxide films 37a, 37b, 37c, 37d, 37e, . . . with a thickness ranging from about 80 to 100 Å between source and drain regions 35a1 and 35a2, between 35b1 and 35b2, between 35c1 and 35c2, between 35d1 and 35d2, between 35e1 and 35e2, . . . , respectively. After a phosphorus-doped polysilicon layer has been formed on the entire surface of the substrate 31, patterning is effected to form floating gates 38a, 38b, 38c, 38d, 38e, . . . inside each trench 33 in the substrate 31 and on each projecting portion between trenches 33. The surfaces of the individual floating gates 38a, 38b, 38c, 38d, 38e, . . . , are thermally oxidized to form second gate insulating films 39a, 39b, 39c, 39d, 39e, . . . with a thickness ranging from 150 to 250 Å. Then, on the substrate 31 and the insulating films 39a, 39b, 39c, 39d, 39e, . . . , a phosphorus-doped polysilicon layer is formed, and patterning is effected to form a control gate 40 having a plurality of parallel patterns extended over the floating gates 38a, 38b, 38c, 38d, 38e, . . . in the direction perpendicular to the individual trenches 33. This produces a structure as shown in FIGS. 15 and 16 (the same structure as shown in FIG. 5).

Figure 17:
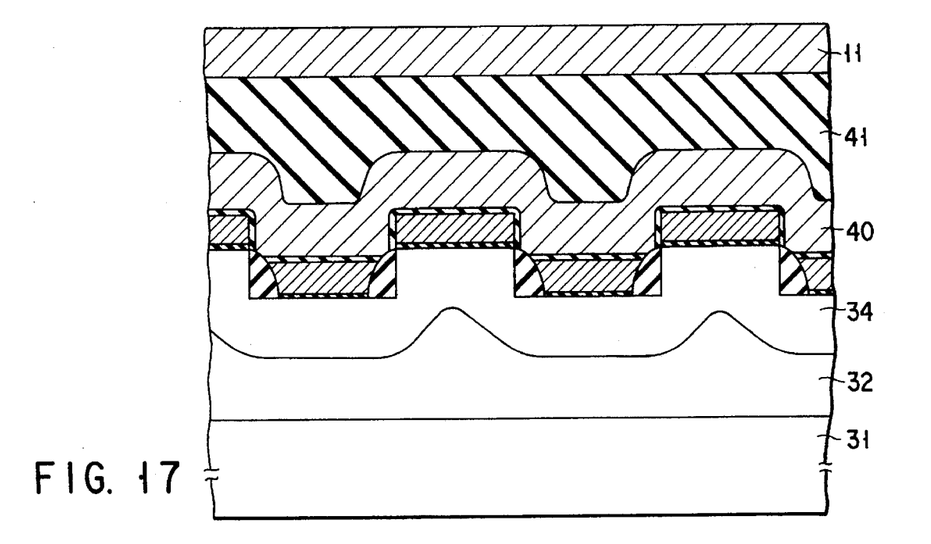
Figure 18:
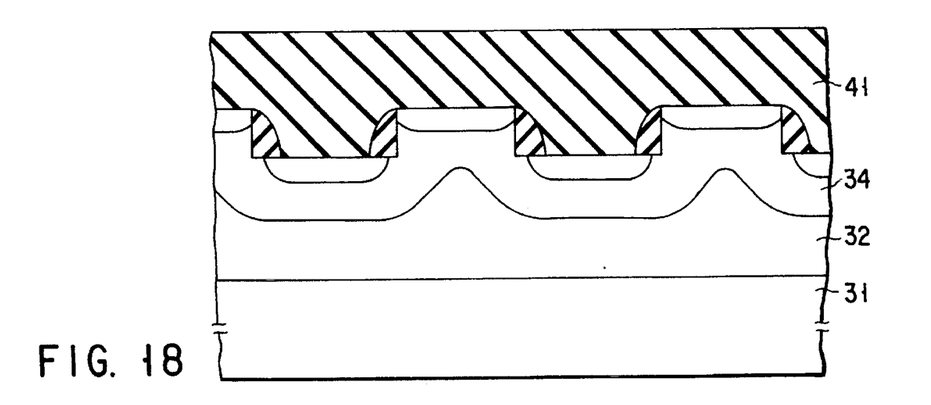

Thereafter, as shown in FIGS. 17 and 18, an interlayer insulating film 41 is formed on the resultant structure. A contact hole is made in the interlayer 41 above the drain region 12-1D of the first cell select MOS transistor 12-1 (not shown). On the interlayer insulating film 41 and inside the contact hole, an aluminium layer or a tungsten silicide layer is formed, and then patterning is effected to form a bit line 11 in the first direction on the bottom of each trench 33 and the interlayer insulating film 41 on each projecting portion between trenches 33.

By the above-described manufacturing method, the memory cells formed at the bottom of the trenches 33 can be isolated form the memory cells formed on the projecting portions between trenches by separating the former from the latter in the direction of depth of the trenches 33, that is, in the direction perpendicular to the main surface of the semiconductor substrate 31. With this isolation, the width of the element isolation area on the pattern plane can be reduced, thereby enabling chip-size reduction and higher integration.

Figure 19A:
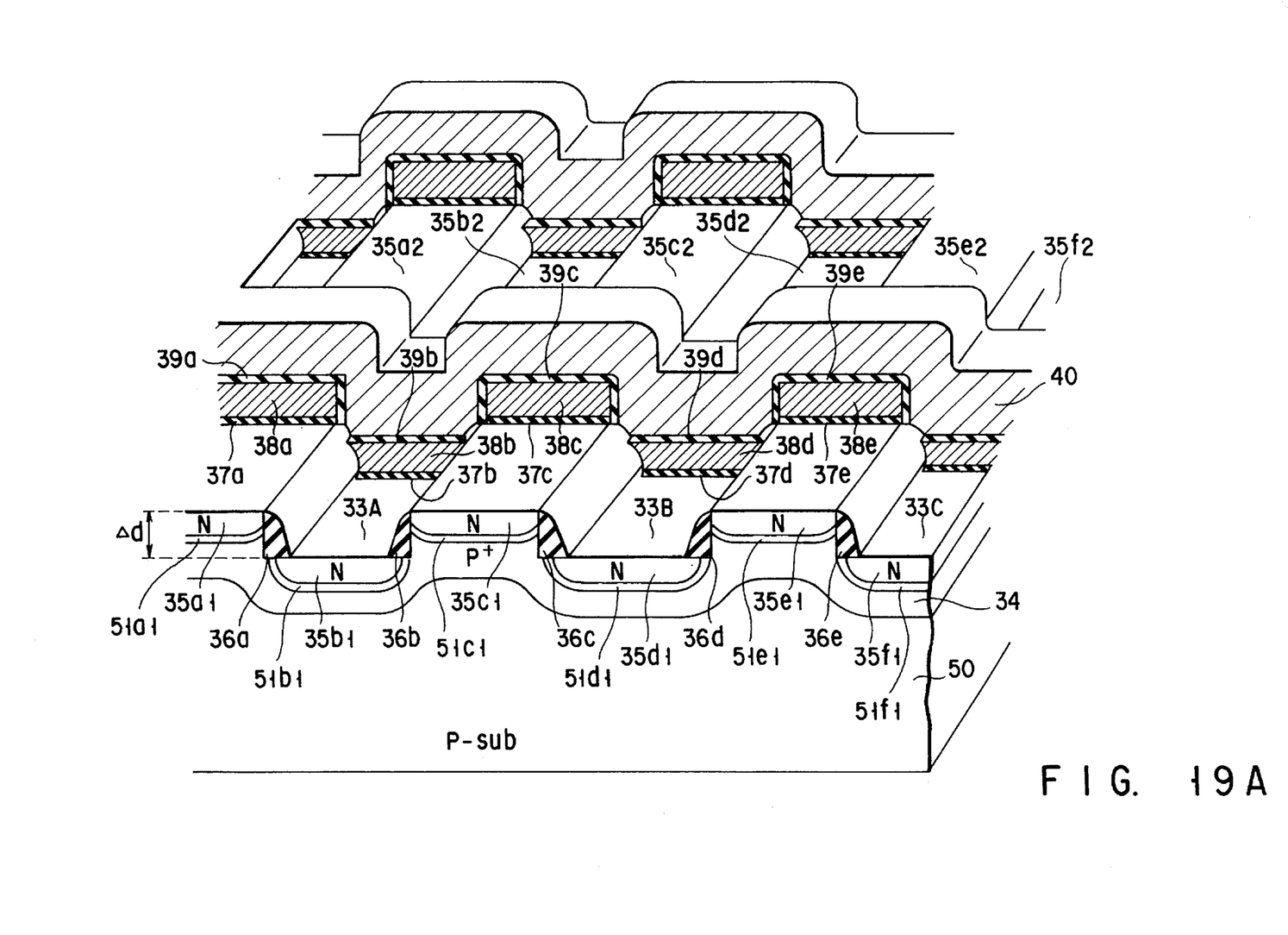
FIGS. 19A to 19C are intended for explanation of a semiconductor integrated circuit device according to a second embodiment of the present invention, and is an exploded perspective view of the important portion of a NOR type $E^2$ PROM.
Figure 19B:
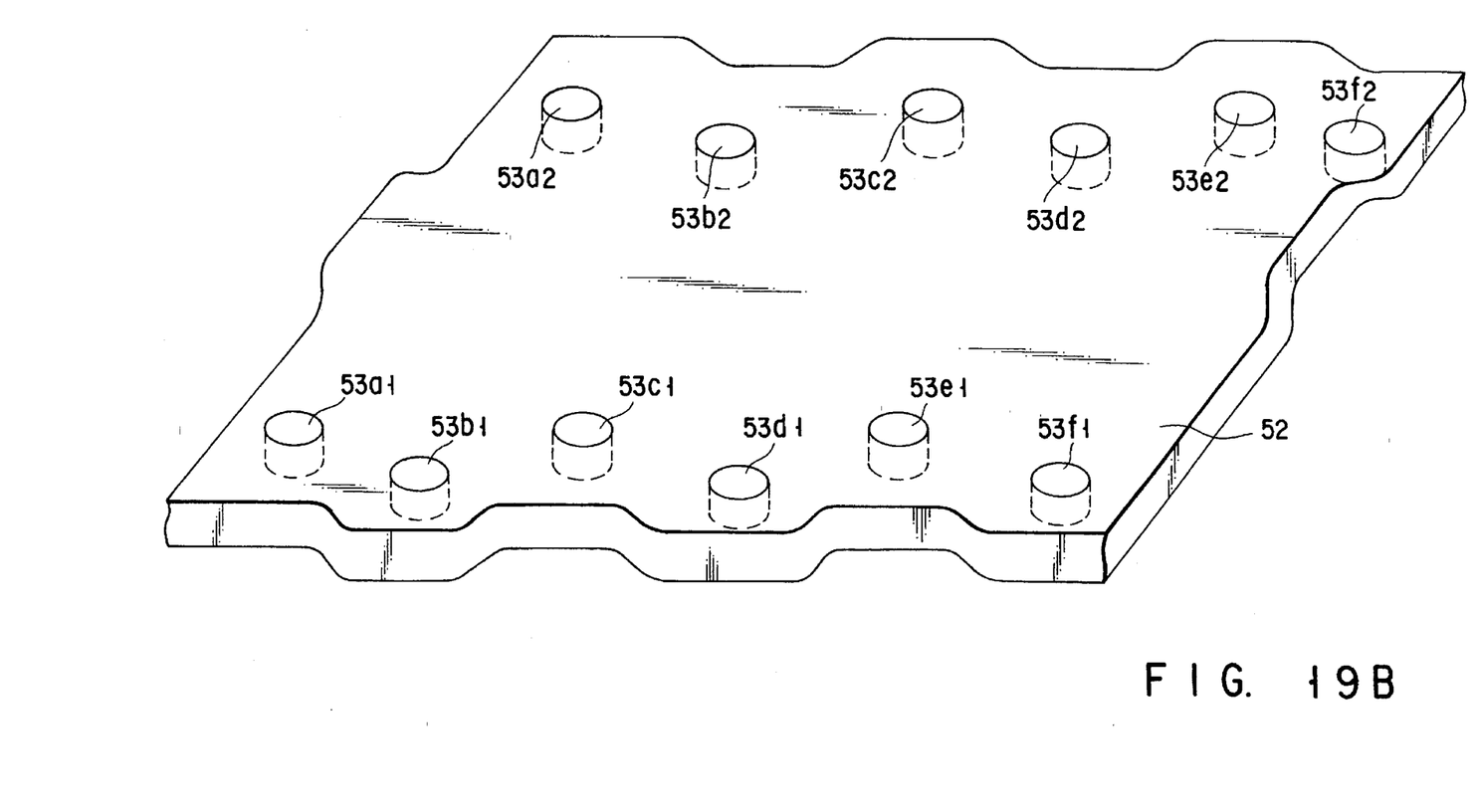
Figure 19C:
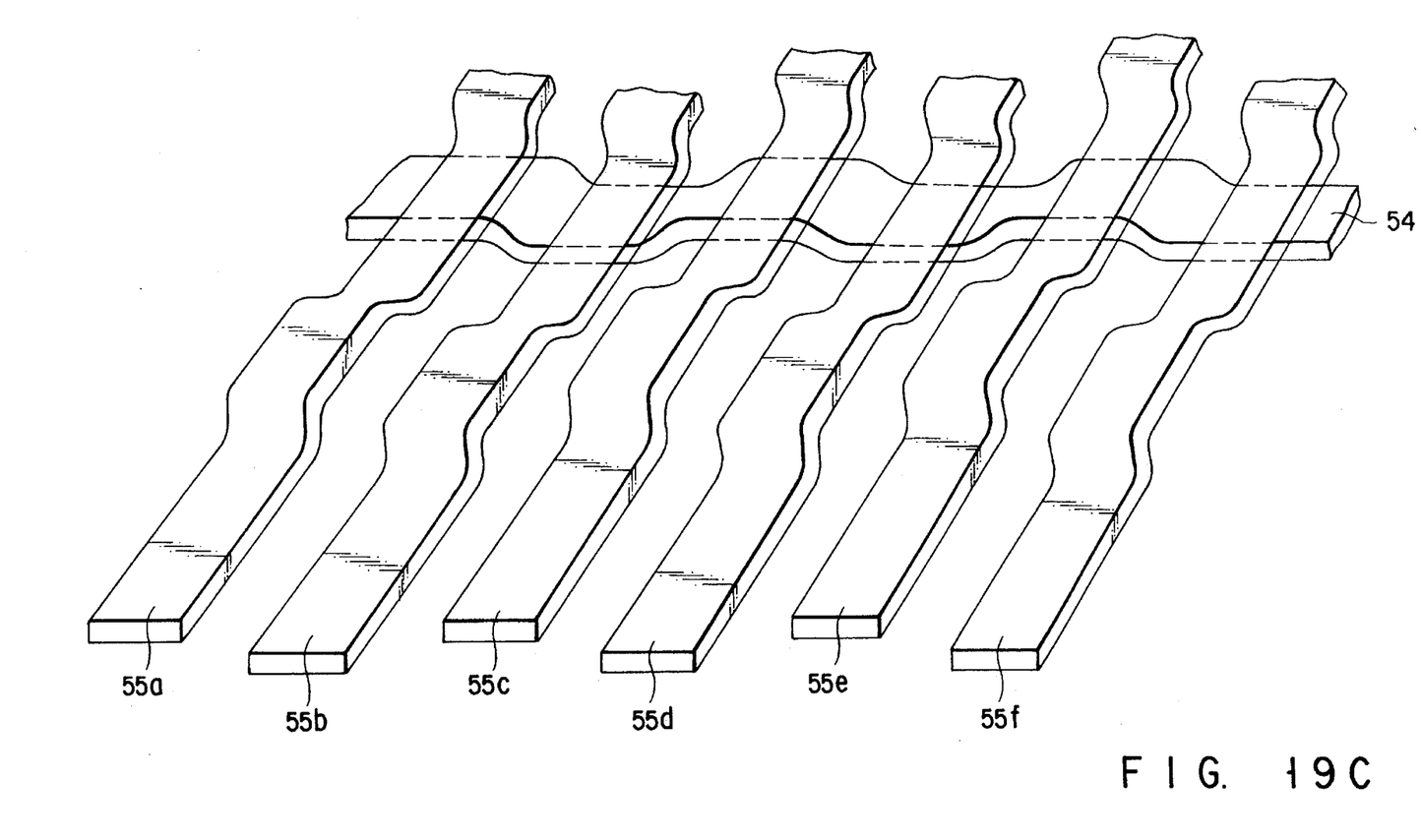

FIGS. 19A to 19C are intended for explanation of a semiconductor integrated circuit device according to a second embodiment of the present invention: FIG. 19A is a perspective view of the arrangement of elements in the major portion of a NOR type $EE^2$ PROM (NOR type flash memory); FIG. 19B is a perspective view of an interlayer insulating film formed on the element arrangement shown in FIG. 19A; and FIG. 19C is a perspective view of bit lines and source lines formed on the interlayer insulating film shown in FIG. 19B. In FIG. 19A, the same parts as those in the NAND type $E^2$ PROM are indicated by the same reference symbols, and their detailed explanation will be omitted. Unlike the NAND type $E^2$ PROM where memory cells must be formed in the p-well region 32 formed at the surface of the n-type semiconductor substrate 31, the NOR type $EE^2$ PROM does not require memory cells to be formed in the p-well region, so that memory cells are formed in a p-type semiconductor substrate 50. When programming is done, a voltage of about 6 V is applied to the drain regions (active regions) of the cell transistors. Therefore, $n^-$-type or $p^-$-type impurity diffusion layers 51a1, 51b1, 51c1, 51d1, 51e1, 51f1, . . . are provided under n-type impurity diffusion layers 35a1, 35b1, 35c1, 35d1, 35e1, 35f1, . . . acting as drain regions to alleviate the electric field, thereby preventing breakdown from occurring at the p-n junction between the n-type impurity diffusion layers 35a1, 35b1, 35c1, 35d1, 35e1, 35f1, . . . and well region 32 ($p^+$-type impurity diffusion layer 34). On the other hand, in an erase operation, 12 V is applied to n-type impurity diffusion layers 35a2, 35b2, 35c2, 35d2, 35e2, 35f2, . . . functioning as the source regions (active regions) of the cell transistors, and as with the drain regions, breakdown can occur at the p-n junction. Therefore, $n^-$-type or $p^-$-type impurity diffusion regions (not shown) are provided under impurity diffusion layers 35a2, 35b2, 35c2, 35d2, 35e2, 35f2, . . . to alleviate the electric field. In this case, by applying a negative bias voltage to the control gate (word line 40), the electric field can be alleviated, thereby reliably preventing breakdown from occurring between the impurity diffusion layers 35a2, 35b2, 35c2, 35d2, 35e2, 35f2, . . . and well region 32 ($p^+$-type impurity diffusion layer 34).

The low-concentration impurity diffusion regions 51a1, 51b1, 51c1, 51d1, 51e1, 51f1, . . . for alleviating electric fields, the impurity diffusion layers 35a1, 35a2, . . . , 35b1, 35b2, . . . , 35c1, 35c2, . . . , 35d1, 35d2, . . . , 35e1, 35e2, . . . , 35f1, 35f2, . . . acting as the source and drain regions are each formed by implanting impurity ions into the $p^+$-type impurity diffusion layer 34 using a known manufacturing process, after the control gate 40 (word line) has been formed.

On the element structure shown in FIG. 19A, an interlayer insulating film 52 as shown in FIG. 19B is formed. In the positions on the interlayer insulating film 52 above and corresponding to the impurity diffusion layers 35a1, 35a2, . . . , 35b1, 35b2, . . . , 35c1, 35c2, . . . , 35d1, 35d2, . . . , 35e1, 35e2, . . . . 35f1, 35f2, functioning as the source and drain regions, contact holes 53a1, 53a2, . . . , 53b1, 53b2, . . . , 53c1, 53c2, . . . , 53d1, 53d2, . . . , 53e1, 53e2, . . . , 53f1, 53f2, . . . are made respectively.

As shown in FIG. 19C, on the interlayer insulating film 52, a source line 54 and bit lines 55a, 55b, 55c, 5d, 55e, 55f, . . . are formed. The source line 54 formed in the direction perpendicular to the trenches 3A, 33B, 33C, . . . is connected to the source regions (n-type impurity diffusion layers) 35*a*2, 35*b*2, 35*c*2, 35*d*2, 35*e*2, 35*f*2, ... via the contact holes 53*a*2, 53*b*2, 53*c*2, 53*d*2, 53*e*2, 53*f*2, .... The source line 54 is made of, for example, a first layer of an aluminum layer or a tungsten silicide layer, and is applied with the ground potential during reading and programming, and with a voltage of about 12 V in an erase operation.

On the other hand, the bit lines 55*a*, 55*b*, 55*c*, 55*d*, 55*e*, 55*f*, ... are formed on the interlayer insulting film 52 above and corresponding to the trenches 33A, 33B, 33C, ... and the projecting portions between trenches, in the same direction that these trenches extend. These bit lines 55*a*, 55*b*, 55*c*, 55*d*, 55*e*, 55*f*, ... are connected to the drain regions (n-type impurity diffusion layers) 35*a*1, 35*b*1, 35*c*1, 35*d*1, 35*e*1, 35*f*1, ... via the contact holes 53*a*1, 53*b*1, 53*c*1, 53*d*1, 53*e*1, 53*f*1, .... The bit lines 55*a*, 55*b*, 55*c*, 55*d*, 55*e*, 55*f*, ... are made of, for example, a second layer of an aluminum layer or a tungsten silicide layer, and a voltage of about 6 V is applied to the selected bit line during programming. Although not shown, an insulating layer intervenes between the source line 54 formed of the first layer of an aluminium layer and the bit lines 55*a*, 55*b*, 55*c*, 55*d*, 55*e*, 55*f* .... formed of the second layer of an aluminium layer, in order to electrically separate the former from the latter.

As described above, with the NOR type $EE^2$ PROM, as with the NAND type $E^2$ PROM, the cell transistors formed at the bottom of the individual trenches 33A, 33B, 33C, ... can be electrically isolated from the cell transistors formed on each projecting portion between trenches by separating the former from the latter in the direction of depth of the trench. Therefore, it is possible to reduce the width of the element isolation region on the pattern plane, thereby enabling cell-size reduction and higher integration.

While in the first and second embodiments, a semiconductor integrated circuit device has been explained using the NAND type $E^2$ PROM and the NOR type $EE^2$ PROM as examples, the present invention may be applied to other semiconductor storage devices or other semiconductor integrated circuit devices, such as EPROMs, OTPs, or DRAMs. To apply the invention to these devices, elements may be isolated by forming additional parallel trenches in the direction perpendicular to the parallel trenches already formed on the surface of the semiconductor substrate to form a lattice of trenches. In this case, the elements are isolated by separating the semiconductor elements formed at the projecting portions of the lattice from those formed at the recessed portions of the lattice in the direction perpendicular to the main surface of the semiconductor substrate.

As explained above, according to the present invention, it is possible to provide a semiconductor integrated circuit device which enables chip-size reduction and higher integration by reducing the element isolation regions.

What is claimed is:

1. A semiconductor integrated circuit device comprising:
    a semiconductor substrate;
    a plurality of trenches formed in parallel at the main surface of said semiconductor substrate;
    a plurality of projecting portions formed between said trenches;
    a first group of devices each formed at a bottom of a corresponding one of said trenches; and
    a second group of devices each formed at a corresponding one of said projecting portions, each of said second group of devices being separated from said first group of devices in a direction of depth of said trenches, thereby insulated from each of said first group of devices.

2. A semiconductor integrated circuit device according to claim 1, wherein said semiconductor substrate contains a semiconductor substrate of a first conductivity type and a well region of a second conductivity type formed in the surface region of the first-conductivity-type semiconductor substrate, and said trenches are formed in said well region.

3. A semiconductor integrated circuit device according to claim 2, further comprising an inversion prevention impurity diffusion region of the second conductivity type which is formed in the surface region of said well region and whose impurity concentration is higher than that of said well region.

4. A semiconductor integrated circuit device according to claim 1, further comprising inversion prevention spacers formed on the sidewall portions of said trenches, for preventing the sidewall portions of said trenches from being inverted, thereby preventing said first and second groups of devices from being electrically connected to each other.

5. A semiconductor integrated circuit device according to claim 4, said spacers are insulting layers formed on said sidewall portions of said trenches.

6. A semiconductor integrated circuit device comprising:
    a semiconductor substrate;
    a plurality of trenches formed in parallel at the surface of said semiconductor substrate;
    a plurality of projecting portions formed between said trenches;
    first active regions of a first group of cell transistors formed at bottoms of said trenches in the semiconductor substrate;
    second active regions of a second group of cell transistors formed on each of said projecting portions;
    first floating gates of said first group of cell transistors, each provided above a portion between said first active regions formed at the bottoms of said trenches;
    second floating gates of said second group of cell transistors, each provided above a portion between said second active regions formed on said projecting portions; and
    a control gate extended over said first and second floating gates in the direction that crosses said trenches, said control gate being shared by the first and second groups of cell transistors,
    wherein the first group of cell transistors formed at the bottoms of each of said trenches are electrically isolated from the second group of cell transistors formed on the projecting portion between said trenches by separating the former from the latter in the direction of depth of said trenches.

7. A semiconductor integrated circuit device according to claim 6, wherein said semiconductor substrate contains a semiconductor substrate of a first conductivity type and a well region of a second conductivity type formed in the surface region of the first-conductivity-type semiconductor substrate, and said trenches are formed in said well region.

8. A semiconductor integrated circuit device according to claim 7, further comprising an inversion prevention impurity diffusion region of the second conductivity type which is formed in said well region and whose impurity concentration is higher than that of said well region.

9. A semiconductor integrated circuit device according to claim 6, further comprising inversion prevention spacers formed on the sidewall portions of said trenches, for preventing the sidewall portions of said trenches from being inverted when potentials of said first floating gates increase, and thereby preventing channels from being formed between said first and second groups of cell transistors.

10. A semiconductor integrated circuit device according to claim 9, wherein said spacers are insulting layers formed on said sidewall portions of said trenches.

11. A semiconductor integrated circuit device comprising:

a semiconductor substrate of a first conductivity type;

a well region of a second conductivity type formed at a surface of said semiconductor substrate;

a plurality of trenches formed in parallel in said well region;

a plurality of projecting portions formed between said trenches;

first drain and source regions of a first group of cell transistors, which have the first conductivity type and are formed at the bottoms of said trenches;

second drain and source regions of a second group of cell transistors, which have the first conductivity type and are formed on said projecting portions;

first gate insulating films of said first group of cell transistors, each of which is formed above a portion between said first drain and source regions at the bottom of each of said trenches;

second gate insulating films of said second group of cell transistors, each of which is formed above a portion between said second drain and source regions formed on each projecting portion;

first floating gates of said first group of cell transistors, each of which is formed on a corresponding one of said first gate insulating films;

second floating gates of said second group of cell transistors, each of which is formed on a corresponding one of said second gate insulting films;

third gate insulating films of said first group of cell transistors, each of which is formed on a surface of a corresponding one of said first floating gates;

fourth gate insulating films of said second group of cell transistors, each of which is formed on a surface of a corresponding one of said second floating gates; and a plurality of control gates formed in parallel on said third and fourth gate insulating films and extended over said said first and second floating gates in the direction perpendicular to said trenches, each of said control gates being shared by a corresponding one of said first groups of cell transistors and a corresponding one of said second groups of cell transistors, wherein the first group of cell transistors, each of which is formed at the bottom of a corresponding one of said trenches are electrically isolated from the second group of cell transistors, each of which is formed on a corresponding one of said projecting portions between said trenches by separating the former from the latter in the direction of depth of said trenches, and NAND type $E^2$ PROM cells where current paths of said first and second groups of cell transistors are alternately connected in series are formed in the direction in which said trenches extend at the bottoms of said trenches and on projecting portions between said trenches.

12. A semiconductor integrated circuit device according to claim 11, further comprising an inversion prevention impurity diffusion region of the second conductivity type which is formed in said well region and whose impurity concentration is higher than that of said well region.

13. A semiconductor integrated circuit device according to claim 11, further comprising inversion prevention spacers formed on the sidewall portions of said trenches, for preventing sidewall portions of said trenches from being inverted when potentials of said first floating gates increase, and thereby preventing channel sections of selected cell transistors and channel sections of unselected cell transistors being electrically connected.

14. A semiconductor integrated circuit device according to claim 13, wherein said spacers are insulating layers formed on said sidewall portions of said trenches.

15. A semiconductor integrated circuit device according to claim 11, further comprising an interlayer insulating film formed on said control gate and said semiconductor substrate, and bit lines formed in the same direction that said trenches extend on said interlayer insulating film on the bottom of each of said trenches and on each projecting portion between said trenches.

16. A semiconductor integrated circuit device according to claim 15, further comprising first and second cell select transistors for selecting said first and second groups of cell transistors which are connected in series, the drains of the first cell select transistors being connected to said bit lines and the sources of the second cell select transistors being grounded.

17. A semiconductor integrated circuit device comprising:

a semiconductor substrate of a first conductivity type;

a plurality of trenches formed in parallel in a first direction at the surface of said semiconductor substrate;

a plurality of projecting portions formed between said trenches;

first drain and source regions of a first group of cell transistors, which have a second conductivity type and are formed at the bottoms of said trenches;

second drain and source regions of a second group of cell transistors, which have the second conductivity type and are formed on said projecting portions;

first gate insulating films of said first group of cell transistors, each of which is formed above a portion between said first drain and source regions at the bottom of a corresponding one of said trenches second gate insulating films of said second group of cell transistors, each of which is formed above a portion between said second drain and source regions on corresponding projecting portions;

first floating gates of said first group of cell transistors, each of which is formed on a corresponding one of said first gate insulating films;

second floating gates of said second group of cell transistors, each of which is formed on a corresponding one of said second gate insulating films;

third floating gates of said first group of cell transistors, each of which is formed on a surface of a corresponding one of said first floating gates;

fourth floating gates of said second group of cell transistors, each of which is formed on a surface of corresponding one of said second floating gates;

a plurality of control gates formed in parallel on said third and fourth gate insulating films and extended over said first and second floating gates in a second direction perpendicular to said first direction, each of said control gates being shared by a corresponding one of said first group of cell transistors and a corresponding one of said second group of cell transistors;

an interlayer insulating film formed on the resultant structure, with contact holes made in the positions on said interlayer insulating film above and corresponding to said drain and source regions;

source lines formed in said second direction on said interlayer insulating film and connected to said source regions via the contact holes made above said source regions; and bit lines formed in said first direction on said interlayer insulating film and electrically isolated from said source lines and connected to said drain regions via the contact holes made above said drain regions, wherein the first group of cell transistors each of which is formed at the bottom of a corresponding one of said trenches are electrically isolated from the second group of cell transistors each of which is formed on a corresponding one of said projecting portions by separating the former from the latter in the direction of depth of said trenches, and NOR type $EE^2$ PROM cells are formed at the bottoms of said trenches and on the projecting portions between said trenches.

18. A semiconductor integrated circuit device according to claim 17, further comprising an inversion prevention impurity diffusion region of the first conductivity type which is formed in the surface region of said semiconductor substrate and whose impurity concentration is higher than that of said semiconductor substrate.

19. A semiconductor integrated circuit device according to claim 18, further comprising a low-concentration impurity diffusion region for alleviating electric fields which is inserted between said source and drain regions and said inversion prevention impurity diffusion region.

20. A semiconductor integrated circuit device according to claim 17, further comprising inversion prevention spacers formed on the sidewall portions of said trenches, for preventing the sidewall portions of said trenches from being inverted when potentials of said first floating gates of said first group of cell transistors increase, and thereby preventing channel sections of selected cell transistors and channel sections of unselected cell transistors being electrically connected.

21. A semiconductor integrated circuit device according to claim 20, wherein said spacers are insulating layers formed on said sidewall portions of said trenches.

* * * * *

UNITED STATES PATENT AND TRADEMARK OFFICE
CERTIFICATE OF CORRECTION

PATENT NO. : 5,610,419
DATED : March 11, 1997
INVENTOR(S) : Shinichi TANAKA

It is certified that error appears in the above-indentified patent and that said Letters Patent is hereby corrected as shown below:

In Claim 5, Col. 10, line 19, "insulting" should read --insulating--.

In Claim 10, Col. 11, line 2, "insulting" should read --insulating--.

In Claim 11, Col. 11, line 33, "insulting" should read --insulating--.

In Claim 11, Col. 11, line 41, before "first and second", delete "said".

Signed and Sealed this

Twenty-eighth Day of October, 1997

Attest:

BRUCE LEHMAN

Attesting Officer

Commissioner of Patents and Trademarks